United States Patent [19]

Masleid et al.

[11] Patent Number: 5,656,963
[45] Date of Patent: Aug. 12, 1997

[54] CLOCK DISTRIBUTION NETWORK FOR REDUCING CLOCK SKEW

[75] Inventors: Robert Paul Masleid; Larry Bryce Phillips, both of Austin, Tex.

[73] Assignee: International Business Machines Corporation, Armonk, N.Y.

[21] Appl. No.: 525,805

[22] Filed: Sep. 8, 1995

[51] Int. Cl.$^6$ .............................................. H03K 19/003
[52] U.S. Cl. ........................ 327/297; 327/292; 327/293; 327/565; 257/208; 257/786
[58] Field of Search ........................ 327/297, 292, 327/293, 565, 291, 295; 257/786, 208, 202, 532

[56] References Cited

U.S. PATENT DOCUMENTS

| | | | |
|---|---|---|---|
| 4,276,594 | 6/1981 | Morley | 364/200 |
| 4,811,343 | 3/1989 | Johansson et al. | 371/15 |
| 4,887,235 | 12/1989 | Holloway et al. | 364/900 |
| 5,056,015 | 10/1991 | Baldwin et al. | 364/200 |
| 5,097,437 | 3/1992 | Larson | 395/775 |
| 5,214,682 | 5/1993 | Clark | 377/56 |
| 5,278,873 | 1/1994 | Lowery et al. | 375/118 |
| 5,325,516 | 6/1994 | Blomgren et al. | 395/550 |
| 5,453,708 | 9/1995 | Gupta et al. | 326/94 |
| 5,517,136 | 5/1996 | Harris et al. | 326/93 |
| 5,521,541 | 5/1996 | Okamura | 327/292 |

OTHER PUBLICATIONS

IBM Technical Disclosure Bulletin, vol. 25 No. 3A Aug. 1982; pp. 1057–1058.
IBM Technical Disclosure Bulletin, vol. 26 No. 5 Oct. 1983; pp. 2377–2378.
IBM Technical Disclosure Bulletin vol. 35 No. 1A Jun. 1992; pp. 284–287.
IBM Technical Disclosure Bulletin vol. 35 No. 3 Aug. 1992; pp. 80–81.
IBM Technical Disclosure Bulletin, vol. 37 No. 6A Jun. 1994; pp. 349–351.

*Primary Examiner*—Timothy P. Callahan
*Assistant Examiner*—Dinh T. Le
*Attorney, Agent, or Firm*—Benman Collins & Sawyer; Michael A. Davis, Jr.

[57] ABSTRACT

A clock distribution network for distributing a clock signal across a VLSI chip. A H-tree is combined with an x–y grid to allow buffering of the clock signal, while minimizing clock skew across the chip. The H-tree distributes a plurality of repower buffer levels above a final repower buffering level. The output of the final level are coupled by the x–y grid to minimizes clock skew caused by the chip and by local loading variations in the circuits.

10 Claims, 3 Drawing Sheets

CLOCK DISTRIBUTION NETWORK FOR REDUCING CLOCK SKEW

FIELD OF THE INVENTION

The present invention relates to a system and method for distributing a clock signal across a VLSI chip, and more particularly to a system and method for providing a low clock skew distribution network.

BACKGROUND OF THE INVENTION

Large high-performance very large scale integration (VLSI) chips have an internal clock that is a function of an external clock. Associated with the internal clock is an internal cycle time. The internal clock cycle time comprises several components, such as (1) delays associated with storage devices on the chip, (2) clock skew, (3) logic evaluation, and (4) signal transmission. Of these four components only the logic evaluation component performs real work, the other three components are overhead that merely add to the cycle An internal clock signal is distributed to the circuits in a chip through some form of distribution network. Clock skew within a chip is the variability in the time that the internal clock signal reaches various parts of the circuit. The main contributors to clock skew are (1) the resistance and capacitance (RC) transmission delay variations, (2) device variations and, (3) localized loading variations.

Clock skew has in the past been a relatively small portion of the cycle time. But as cycle times decrease, that proportion of the clock skew to the cycle time has dramatically increased due to both the base technology and to the increase in typical chip sizes. In addition to clock skew's effect on a circuit's cycle time, the delay between a circuit's external clock and its internal clock in proportion to cycle time has been increasing, which makes interfacing difficult. Conventional techniques for controlling this delay are also limited by clock skew since they rely on sampling the internal clock.

Current techniques to control clock skew focus on controlling the RC variations by equalizing the routing loading and/or distance, and by controlling the loading variations by adding dummy loads to equalize the load capacitance of the distribution network. These techniques are limited in their effectiveness by both the precision to which they can equalize loads and distance, and by ignoring the device (both transistor and line) variations.

Accordingly, what is needed is a system and method for reducing the clock skew in a clock distribution network. The present invention addresses such a need.

SUMMARY OF THE INVENTION

The present invention is a low clock skew clock distribution system and method. The system and method comprises means for accepting a primary clock signal, tree means for deriving a plurality of separate clock signals from the primary clock signal where the tree means includes a plurality of terminal points located on a chip. The system and method further comprises repower means for transmitting the plurality of separate clock signals to the plurality of terminal points, and grid means for coupling adjacent ones of the plurality of terminal points, whereby the plurality of clock signals arrive at the plurality of terminal points on the chip at a uniform arrival time.

According to the system and method disclosed herein, the present invention smooths local imbalances in the circuits of the chip to minimize clock skew.

DESCRIPTION OF THE INVENTION

The present invention relates to an improvement in clock distribution networks. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1A:
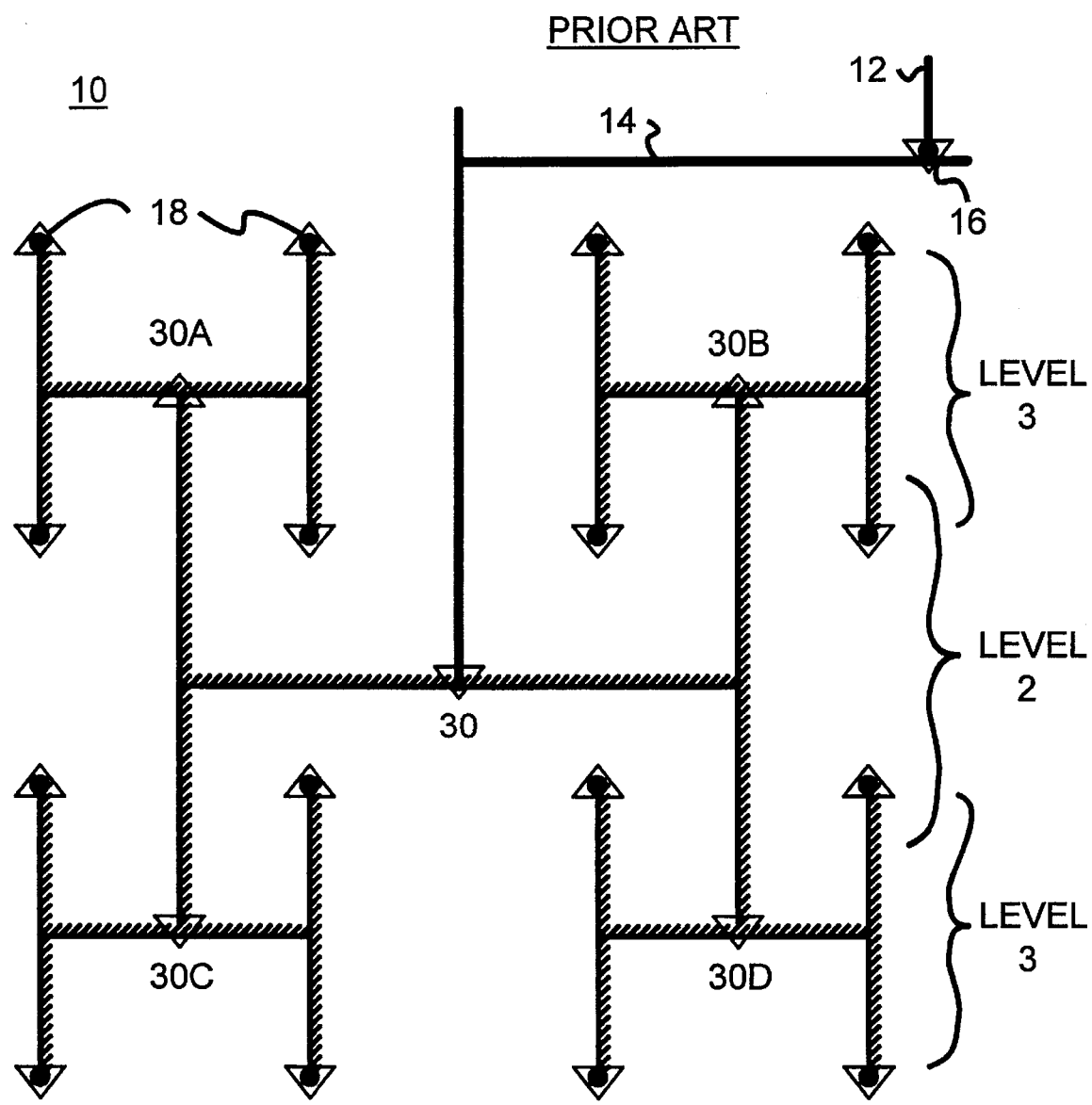
FIGS. 1A and 1B are diagrams illustrating conventional H-trees for distributing a clock signal to a chip.
Figure 1B:
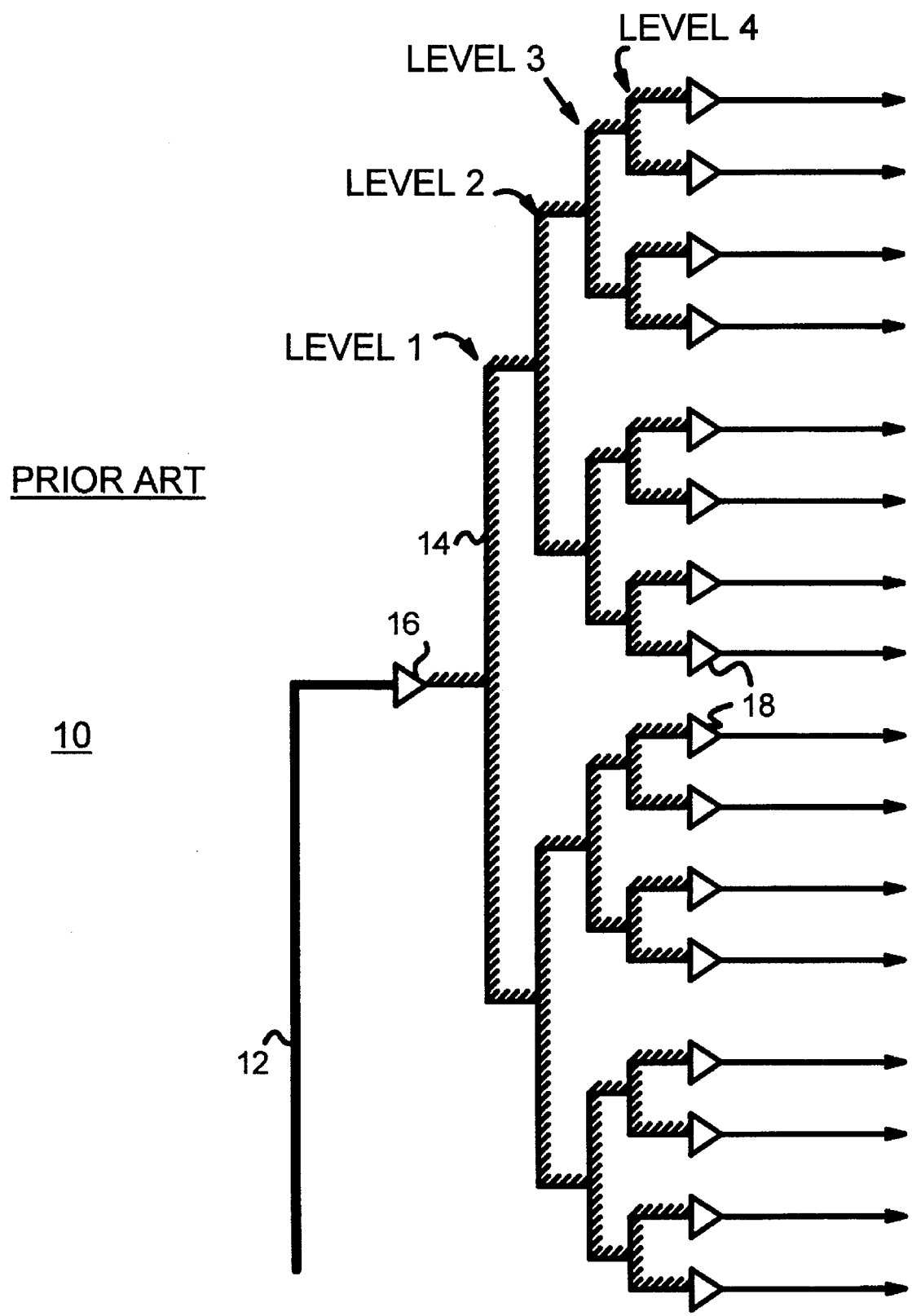

An H-tree network is a conventional method for distributing a clock signal to circuits on a VLSI chip. FIGS. 1A and 1B are diagrams illustrating conventional H-trees 10. FIG. 1A depicts a classic H-tree and FIG. 1B depicts a one-way H-tree. An H-tree 10 is used to distribute an external clock signal received from a primary input 12 on a chip to other areas of the chip using a network of branching wires 14. The branching wires 14 are laid out in a hierarchal succession of H's to form various levels of the H-tree 10.

As shown, a new level of the H-tree 10 is formed from the terminal points, or tips, of the preceding level of in the H-tree 10. A three-level H-tree is shown in FIG. 1A, and a four-level H-tree 10 is shown in FIG. 1B. In FIG. 1A, however, only the lower quarter of the H-tree 10 is shown.

Each tip of an H in the H-tree 10 includes a repower buffer for repowering the clock signal and for distributing the clock signal to the following level. Repower buffers, 30A, 30B, 30C, and 30D are shown on level 2. The repower buffer on the first level of the H-tree 10 is called a pre-driver buffer 16. The repower buffers on the final level of the H-tree 10, which deliver the clock signal to the circuits on the chip, are called final drivers 18. Disbursing the final drivers 18 across the chip in this fashion spreads the clock distribution burden among many devices, rather than over burdening one large centrally located driver.

Although conventional H-trees 10 are capable of delivering the clock signal to all locations on the chip at the same time, H-trees 10 cannot handle cross-chip imbalances of clock load and cross-chip variations of RC transmission delays. If the H-tree is correctly tuned, then the clock arrival time of neighboring circuits will be substantially the same. However, for two circuits that are nearby each other, but in different branches of the H-tree, any imbalance occurring at one clock delivery point will advance or retard the clock arrival time in that area of the chip, producing discrepancies in the clock arrival times of the two circuits. Thus, H-trees 10 do not provide a mechanism to correlate the various clock delivery points across the chip to smooth out local imbalances in the clock signal distribution.

Besides a clock signal, a power signal is also delivered to various areas of chip. A network called an x-y grid is typically used to distribute the power signal across the chip. An x-y grid comprises a series of intersecting vertical and horizontal wires on the chip connected at the intersections. The primary disadvantage of the x-y grid is there is low skew in the power signal near the areas of the chip where the power signal is connected to the x-y grid, and high skew in the signal at remote regions of the x-y grid due to RC delays. The x-y grid does, however, provide good local averaging of the arrival times of the power signal at the intersections of the grid, since the intersections are interconnected.

Figure 2:
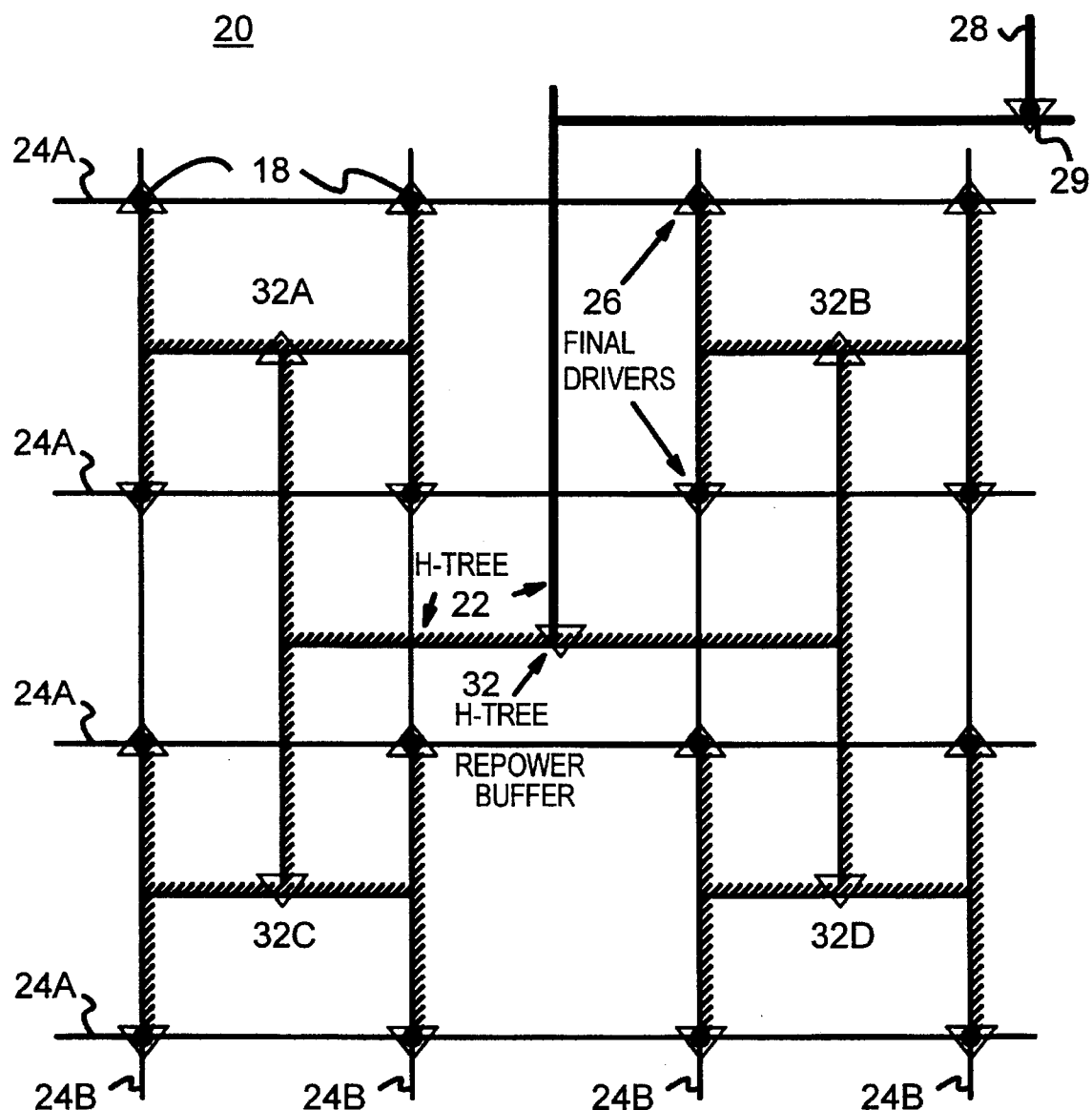
FIG. 2 is a block diagram depicting a clock distribution network of the present invention.

The present invention is a system and method for combining an H-tree with an x–y grid to provide a distribution network that smooths local imbalances to minimize clock skew. To more particularly illustrate the clock distribution network in accordance with the present invention, refer now to FIG. 2 depicting a block diagram of one embodiment of such a system. The distribution network 20 includes an H-tree 22 and an x–y grid 24. The x–y grid comprises a plurality of horizontal wires 24A, and plurality of intersecting vertical wires 24B. The x–y grid 24 is used to interconnect the final drivers 26 on the lowest level of the H-tree 22.

According to the present invention, instead of using the H-tree 22 to distribute the clock signal to circuits on a chip using final drivers 26, the H-tree 22 is used to distribute the clock signal to a x–y grid 24 using the final drivers 26, and the x–y grid 24 is used to transmit the clock signals from the final drivers 26 to the circuits on the chip.

In operation, a pre-driver buffer 29 drives the clock signal from the primary chip input 28 to a repower buffer 32. The clock signal is then transmitted from the repower buffer 32 to four repower buffers, 32A, 32B, 32C, and 32D. After being transmitted from the four repower buffers, 32A, 32B, 32C, and 32D, the clock signal is arrives at the sixteen final drivers 26 shown on the third level.

Assuming that the propagation rates of the branching wires 14 are uniform, the clock signal arrives simultaneously at the final drivers 26. Assuming that the input capacitance loads of the final drivers 26 are the same, then the clock signal arrives at x–y grid 24 at the same time. The present invention therefore eliminates the disadvantage of the x–y grid 24 when used alone, which is that signals do not reach the intersections of the grids at the same time.

Assuming, however, that one of the final drivers 26 is given a higher loading, then the circuits in that segment of the H-tree 22 will have the clock signal retarded, and the clock signal will arrive at the x–y grid at different times. By connecting the x–y grid 24 to the terminal points of the H-tree 22 to interconnect the final drivers 26, the present invention averages the timing error over adjacent segments of the H-tree 22, even though the adjacent segments may be separated by many levels of the H-tree 22.

The clock distribution network of the present invention offers several improvements over traditional clock distribution methods. The use of the H-tree 22 to distribute pre-driver buffers 29 decreases localized power supply noise typically found when concentrating large drivers, while still maintaining skew control. Also by distributing the pre-drivers buffers 29, the degradation due to RC effects is minimized, which will improve the transition time of the clock signal and minimize power dissipation due to overlap current in the final drivers 26. Distribution of the final drivers 26 across the chip eases the problem of power noise when the clock signal switches, and also allows for the use of larger on chip decoupling capacitors due to the ability to effectively distribute them over a much wider area.

The x–y grid 24 solves many difficulties when used with the H-tree 22. The x–y grid 24 creates a virtual plane for the clock system that in itself lessens skew and transition time degradation due to RC effects. The x–y grid 24 also thereby reduces skew due to local concentrations of loads, without resorting to adding dummy loads that increase chip power. It eliminates hard clock-domain boundaries that are the source for fast path timing problems between storage devices. The x–y grid 24 ties all of the final buffers 26 together (and due to the plane effect increases the number of buffers that are within one transition time's RC delay of each other) which greatly decreases skew due to random device variations. Finally, the x–y grid 24 eliminates the need to manually or automatically route clocks, and being a much more regular structure that can be planned for at the floor-plan stage and more easily analyzed, will improve skew due to fewer deviations from ideal routing imposed by other chip structures, such as large custom blocks, for example.

A clock distribution network combining the characteristics of an H-tree and an x–y grid has been disclosed that controls noise and significantly reduces clock skew in large high-speed VLSI circuits.

Although the present invention has been described in accordance with the embodiments shown, one of ordinary skill in the art will readily recognized that there could be variations to the embodiments and those variations would be within the spirit and scope of the present invention. For example, the x–y grid has been described as connecting final drivers that are horizontally and vertically adjacent to one another. The x–y grid, however, may be configured to connect the final drivers in any geometrical arrangement, such as connecting diagonally adjacent final drivers, for example. Accordingly, many modifications may be made by one of ordinary skill in the art without departing from the spirit and scope of the appended claims.

What is claimed is:

1. A clock distribution network, comprising a primary input for accepting a primary clock signal;

tree means for deriving a plurality of separate clock signals from the primary clock signal, the tree means including a first level and a last level, wherein the last level includes a plurality of final drivers located on a chip;

repower means for transmitting the plurality of separate clock signals to the plurality of said final drivers; and an X–Y grid for vertically and horizontally connecting all of the plurality of final drivers, such that clock skew across the chip is reduced.

2. A network as in claim 1 wherein the primary input includes a pre-driver buffer.

3. A network as in claim 2 wherein the tree means comprises a network of branching wires laid out in a hierarchal succession of H's to form various levels.

4. A network as in claim 3 wherein the network of branching wires forms an H-tree.

5. A network as in claim 4 wherein the repower means comprise repower buffers.

6. A method for minimizing clock skew when distributing an external clock signal to various segments of a chip, the method comprising the steps of:

(a) accepting the external clock signal;

(b) deriving a plurality of separate clock signals from the external clock signal using a network of branching wires, the network of branching wires forming a first level and a last level, wherein the last level includes a plurality of final drivers;

(c) transmitting the plurality of separate clock signals to the plurality of final drivers; and (d) vertically and horizontally interconnecting all of the plurality of final drivers with a x–y grid to transmit the plurality of separate clock signals from the final drivers to the chip.

7. A method as in claim 6 wherein step (a) further includes the step of:

(a1) accepting the external clock signal at a primary chip input.

8. A method as in claim 7 wherein step (c) further includes the step of:

(c1) transmitting the plurality of separate clock signals using a plurality of repower buffers.

9. A method as in claim 8 wherein step (d) further includes the step of:

(d1) coupling the final drivers using an x–y grid to smooth local imbalances in the chip and to minimize clock skew.

10. A clock distribution network, comprising a primary chip input for accepting a primary clock signal;

a network of branching wires coupled to the primary chip input for deriving a plurality of separate clock signals from the primary clock signal, the network of branching wires having a first level and a last level, wherein the last level includes a plurality of final drivers located on a chip;

repower means for transmitting the plurality of separate clock signals to the plurality of final drivers; and a grid comprising intersecting wires forming a plurality of intersections for coupling the plurality of final drivers, wherein each one of the plurality of final drivers is connected to the grid at respective intersection, and wherein the grid transmits the plurality of clock signals from the final drivers to the chip.

* * * * *

UNITED STATES PATENT AND TRADEMARK OFFICE
CERTIFICATE OF CORRECTION

PATENT NO. : 5,656,963
DATED : August 12, 1997
INVENTOR(S) : Masleid, et. al.

It is certified that error appears in the above-indentified patent and that said Letters Patent is hereby corrected as shown below:

Title page, item [57],
In the abstract: "A H-tree" should read "An H-tree," "minimizes" should read "minimize"

Column 3, Line 23: "signal is arrives" should read "signal arrives"

Signed and Sealed this

Twenty-first Day of September, 1999

Attest:

Q. TODD DICKINSON

*Attesting Officer*          *Acting Commissioner of Patents and Trademarks*